United States Patent
Chainer et al.

(10) Patent No.: US 10,563,937 B2
(45) Date of Patent: Feb. 18, 2020

(54) COOLING SYSTEMS FOR COOLING ELECTRONIC COMPONENTS

(71) Applicant: International Business Machines Corporation, Armonk, NY (US)

(72) Inventors: Timothy J. Chainer, Putnam Valley, NY (US); Pritish R. Parida, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 17 days.

(21) Appl. No.: 16/035,753

(22) Filed: Jul. 16, 2018

(65) Prior Publication Data

US 2020/0029465 A1 Jan. 23, 2020

Related U.S. Application Data

(62) Division of application No. 14/924,805, filed on Oct. 28, 2015, now Pat. No. 10,225,952.

(51) Int. Cl.
*F28F 27/02* (2006.01)
*H05K 7/20* (2006.01)
*G06F 1/20* (2006.01)

(52) U.S. Cl.
CPC ......... *F28F 27/02* (2013.01); *H05K 7/20309* (2013.01); *H05K 7/20327* (2013.01); *H05K 7/20509* (2013.01); *H05K 7/20818* (2013.01); *F28F 2250/06* (2013.01); *G06F 1/20* (2013.01); *G06F 2200/201* (2013.01)

(58) Field of Classification Search
CPC ............... H05K 7/20281; H05K 7/208; H05K 7/20836; H05K 7/20309; H05K 7/20254; H05K 7/2029; F28F 2250/06; F28F 27/02
See application file for complete search history.

(56) References Cited

U.S. PATENT DOCUMENTS

| 6,519,955 | B2 | 2/2003 | Marsala |
| 6,679,081 | B2 | 1/2004 | Marsala |

(Continued)

FOREIGN PATENT DOCUMENTS

CN 103758658 A 4/2014

OTHER PUBLICATIONS

IBM, "Recovery Act: Economizer Based Data Center Liquid Cooling with Advanced Metal Interfaces", Final Technical Report, Prepared for US Department of Energy, DOE Award No. DE-EE0002894, Nov. 30, 2012, 103 pages, © Copyright IBM Corp. 2012 All Rights Reserved.

(Continued)

*Primary Examiner* — Jon T. Schermerhorn, Jr.
(74) *Attorney, Agent, or Firm* — Nicholas D. Bowman (57) ABSTRACT

A first fluid is heated in a preheating section and passes into an evaporator coupled to a first electronic component. Operational heat from the first electronic component vaporizes the first fluid. A second fluid passes into a cold plate coupled to a second electronic component. Operational heat from the second electronic component heats the second fluid. First and second portions of the second fluid output from the cold plate pass through first and second routes, respectively. The first portion becomes thermally coupled to the preheating section and the second portion bypasses the preheating section. Heat transfer from the first portion to the preheating section causes the heating of the first fluid in the preheating section.

20 Claims, 6 Drawing Sheets

(56) References Cited

U.S. PATENT DOCUMENTS

| | | |
|---|---|---|
| 7,486,513 B2 | 2/2009 | Hall et al. |
| 7,866,173 B2 | 1/2011 | Brunschwiler et al. |
| 8,194,406 B2 | 6/2012 | Campbell et al. |
| 8,351,200 B2 | 1/2013 | Arimilli et al. |
| 8,787,015 B2 | 7/2014 | El-Essawy et al. |
| 8,899,060 B2 | 12/2014 | Hall et al. |
| 2011/0079376 A1 | 4/2011 | Loong et al. |
| 2012/0194996 A1 | 8/2012 | El-Essawy et al. |
| 2013/0006427 A1 | 1/2013 | Hall et al. |
| 2013/0077247 A1 | 3/2013 | Campbell et al. |
| 2013/0255925 A1 | 10/2013 | Koontz et al. |
| 2013/0340978 A1 | 12/2013 | Agostini et al. |
| 2014/0137581 A1 | 5/2014 | Cho |
| 2014/0224469 A1 | 8/2014 | Mirmobin et al. |
| 2015/0237767 A1 | 8/2015 | Shedd et al. |
| 2017/0127563 A1 | 5/2017 | Chainer et al. |

OTHER PUBLICATIONS

Unknown, "Computer cooling," From Wikipedia, the free encyclopedia, last modified on Oct. 8, 2015 at 11:14, printed Oct. 27, 2015 at 11:15, 21 pages.

Chainer et al., "Two-Phase Cooling With Ambient Cooled Condensor," Application No. 14/750,946, filed Mar. 20, 2015.

Chainer et al., "Two-Phase Cooling With Ambient Cooled Condensor," U.S. Appl. No. 14/750,946, filed Jun. 25, 2015.

IBM, List of IBM Patents or Patent Applications Treated as Related, Jul. 13, 2018, 2 pages.

COOLING SYSTEMS FOR COOLING ELECTRONIC COMPONENTS

STATEMENT REGARDING FEDERALLY SPONSORED RESEARCH OR DEVELOPMENT

This invention was made with Government support under Contracts Nos. FA8650-14-C-7466 and HR0011-13-C-0035 awarded by Defense Advanced Research Projects Agency (DARPA). The Government has certain rights in this invention.

BACKGROUND

The present disclosure relates generally to the field of electronic component cooling, and in particular to closed-loop cooling systems.

While operating within a computer system, electronic components may generate excess heat. Left unchecked, this excess heat may increase the operating temperatures of the electronic components to deleterious levels and thereby cause premature failure or suboptimal performance of the computer system. To mitigate these problems, a variety of thermally dissipative systems may be used to conduct this unwanted heat away from the electronic components that generate it.

SUMMARY

According to embodiments, aspects of the present disclosure include a system. Within the system, an evaporator is thermally coupled to a first set of electronic components such that operational heat generated by the first set of electronic components causes at least partial vaporization of a first fluid as the first fluid passes through the evaporator. There is a preheating section through which the first fluid passes before entering the evaporator. A cold plate is thermally coupled to a second set of electronic components such that operational heat generated by the second set of electronic components causes an increase in a temperature of a second fluid as the second fluid passes through the cold plate. A first portion of the second fluid output from the cold plate passes through a first route. The first portion becomes thermally coupled to the preheating section such that heat transfer from the first portion to the preheating section causes an increase in a temperature of the first fluid as the first fluid passes through the preheating section. A second portion of the second fluid output from the cold plate passes through a second route. The second portion bypasses the preheating section.

According to embodiments, aspects of the present disclosure may further include a method. As part of the method, a first fluid is vaporized, at least partially and as the first fluid passes through an evaporator thermally coupled to a first set of electronic components while circulating within a first cooling loop, using operational heat generated by the first set of electronic components. The first fluid is pumped through a preheating section disposed in the first cooling loop between an output of a condenser and an input of the evaporator. A second fluid is heated, as a second fluid passes through a cold plate thermally coupled to a second set of electronic components while circulating within a second cooling loop, using operational heat generated by the second set of electronic components such that there is an increase in a temperature of the second fluid. A first portion of the second fluid as output from the cold plate is pumped toward an input of a heat exchanger via a first route disposed in the second cooling loop. The first route is thermally coupled to the preheating section such that heat transfer from the first portion to the preheating section as the first portion passes through the first route causes an increase in a temperature of the first fluid as the first fluid passes through the preheating section. A second portion of the second fluid as output from the cold plate is pumped toward the input of the heat exchanger via a second route disposed in the second cooling loop. The second route is arranged such that the first portion passes closer to the preheating section of the first loop than the second portion passes to the preheating section.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Aspects of the present disclosure relate generally to the field of electronic component cooling, and in particular to closed-loop cooling systems. While the present disclosure is not necessarily limited to such applications, various aspects of the disclosure may be appreciated through a discussion of various examples using this context.

As used herein, a "set" may refer generally to one or more of the item to which it relates.

As used herein, "computer systems" may refer generally to any computers or servers. Computer systems may include, without limitation, web servers, application servers, mail servers, virtual servers, supercomputers, and high performance computing systems.

As used herein, "electronic components" may refer generally to any electronic parts included in computer systems. Electronic components may include, without limitation, processor chips, optical disk drives, hard disks, field-programmable gate arrays (FPGAs), and random-access memory (RAM) components (e.g., memory modules).

As used herein, "processor chips" may refer generally to any integrated circuits that provide computational capabilities for computer systems. Processor chips may include, without limitation, microprocessors such central processing units (CPUs) or graphics processor units (GPUs). In some embodiments, processor chips may be arranged in stacked, high density configurations.

As used herein, "high heat flux electronic components" may refer generally to any electronic components that have mean operational heat outputs of greater than 10 W/cm$^2$. In some embodiments, the term may refer to electronic components that have mean operational heat outputs of greater than 40 W/cm$^2$. In general, many processor chips (especially stacked processor chips) may be high heat flux electronic components.

As used herein, "low heat flux electronic components" may refer generally to any electronic components that have mean operational heat outputs of less than 10 W/cm$^2$. In some embodiments, the term may refer to electronic components that have mean operational heat outputs of less than 5 W/cm$^2$. In general, many memory modules may be low heat flux electronic components.

As used herein, a "fluid" may refer generally to any substance that readily flows under applied pressure. A fluid may exist in a liquid-phase, a vapor-phase, or a combination of these two phases. Examples of fluids may include, without limitation, water and R1234ze.

As used herein, "vapor quality" may refer generally to the mass fraction in a saturated fluid that is vapor. For example, a vapor quality of 0.8 means that the fluid is a mixture of 80% vapor and 20% liquid by mass. A subcooled liquid is generally referred to as having "negative vapor quality".

As used herein, a "closed cooling loop" may refer generally to a sealed set of tubes (e.g., piping) containing a substantially fixed quantity of fluid that circulates about the set of tubes and a set of electrical and/or mechanical devices, wherein the devices are configured to monitor and/or adjust the pressure and/or temperature of the fluid. A closed cooling loop is generally used for cooling a set of electronic components.

As used herein, a "two-phase cooling loop" may refer generally to a closed cooling loop in which the fluid circulating within the loop exists in substantially entirely a liquid-phase when it passes through at least one portion of the loop (e.g., where the fluid has a vapor quality of 0 or a negative vapor quality) and exists primarily as a vapor-phase when it passes through at least one other portion of the loop (e.g., where the fluid has a vapor quality of 0.5 or greater).

As used herein, a "single-phase cooling loop" may refer generally to a closed cooling loop in which the fluid circulating within the loop exists substantially entirely in a single-phase (e.g., a liquid-phase) throughout the loop.

Figures 1A, 1B:
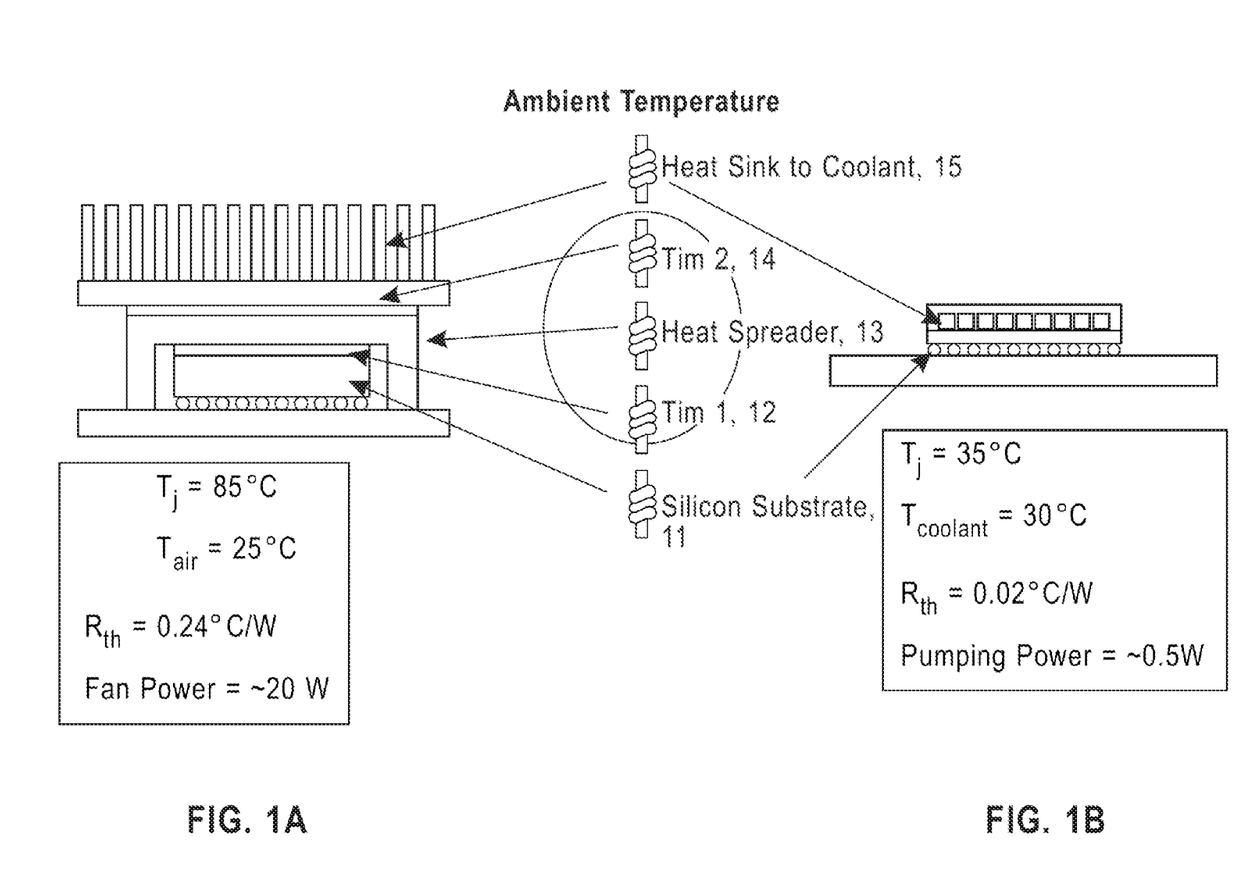
FIG. 1A illustrates a schematic diagram of a typical air cooling system for cooling an electronic component within a computer system.
FIG. 1B illustrates a schematic diagram of an embedded closed-loop cooling system for cooling an electronic component within a computer system, in accordance with embodiments of the present disclosure.

Referring now to FIGS. 1A and 1B, shown are schematic diagrams comparing different systems for cooling an electronic component within a computer system (e.g., a server). Specifically, a typical open air cooling system (shown in FIG. 1A) is compared with an embedded closed-loop cooling system (shown in FIG. 1B), according to embodiments of the present disclosure. In both figures, the exemplary electronic components being cooled are complementary metal-oxide semiconductor (CMOS) processor chips (e.g., microprocessors) that conduct heat through their silicon substrates 11.

In the air cooling system of FIG. 1A, the heat transferred through the silicon substrate 11 is further conducted through a first thermal interface material (TIM1) 12 that provides thermal contact between (i.e., thermally couples) the silicon substrate 11 and a heat-spreader 13. The heat spreader, which is typically made of copper, is thermally coupled, through a second thermal interface material (TIM2) 14, to an air cooled heat sink 15. The air cooled heat sink 15 conducts heat to an ambient environment (e.g., the air within a data center housing the computer system). In one example, the fan power used by this open air cooling system may be about 20 W, an ambient air temperature within the data center $T_{air}$ may be about 25° C., and a thermal resistance $R_{th}$ for the open-air-cooled computer system may be approximately 0.24° C./W. Assuming these values, a 250 W operational heat output $Q_R$ for the processor chip would result in about a 60° C. temperature gradient between the ambient environment temperature $T_{air}$ and a processor chip temperature $T_j$. As $T_j = Q_R * R_{th} + T_{ambient}$, this would mean that the processor chip temperature $T_j$ would be about 85° C.

The embedded closed-loop cooling system of FIG. 1B (in contrast with the open air cooling system of FIG. 1A) may not require the TIM1 12, the heat spreader 13, or the TIM2 14. This, among other factors, may cause the closed-loop-cooled computer system to have thermal resistance $R_{th}$ of about 0.04° C./W or less—which is significantly less than the thermal resistance $R_{th}$ of about 0.24° C./W found in its open-air-cooled counterpart of FIG. 1A. This reduced thermal resistance may result in reduced junction temperature, which can minimize processor power consumption with respect to similar computational throughput. For example, the pumping power used by the closed-loop-cooled system would be about 0.5 W, according to some embodiments. In general, as compared with large channel or pool boiling approaches, a single or two-phase heat transfer involving small cavity channels (such as the embedded channels shown in FIG. 1B) is beneficial due to larger heat transfer surface per unit flow area near the heat source.

Among closed-loop cooling systems generally, two-phase cooling loops may be more effective than single-phase cooling loops for cooling high heat flux electronic components. Specifically, in some instances, the use of fluid flow boiling in two-phase loops may more effectively mitigate junction temperature rise across processor chips than the use of fluid flowing in comparable single-phase loops. On the other hand, single-phase cooling loops may be appropriate for cooling some low heat flux electronic components. For example, in some instances, memory modules may be effectively cooled by water flowing through single-phase loops.

In some embodiments of the present disclosure, a single-phase loop and a two-phase loop may be used together within a single computer system to cool various electronic components of the computer system. More specifically, the single-phase loop may be used to cool a first set of the computer system's electronic components while at the same time the two-phase loop cools a second set of the computer system's electronic components.

Furthermore, in some embodiments, controlled preheating of the fluid in the two-phase loop may occur. Specifically, the temperature of the fluid in the two-phase loop as it nears the set of electronic components to be cooled may be monitored/adjusted so that flow boiling of the fluid happens at the correct location. This is important because vaporization of the fluid that occurs at an improper location within the loop may degrade the two-phase cooling performance.

In some embodiments, this fluid preheating in the two-phase loop may be driven by waste heat output from the fluid of the single-phase loop. As demonstrated by the following example, this may significantly increase the efficiency of the two-phase loop.

In this example, the set of electronic components cooled by the two-phase loop is a stacked set of processor chips. The heat output by the stack $Q_{chip}$ is about 175 W. The two-phase loop transfers this heat to an outdoor set of cooling devices through a condenser. A first energy cost for cooling the stack is the power required by the outdoor set of cooling devices $Q_{cs}$ (e.g., pumps and fans of an outdoor loop). This cost is assumed to be about 3.4% of the heat load to be dissipated. Thus, based on the following equation, $Q_{cs}$ is estimated to be about 6 W in this example.

$$Q_{cs} = 0.034 \times 175 \text{ W} \sim 6 \text{ W}$$

Continuing the example further, another energy cost for cooling the stack is the pumping power required to circulate the fluid throughout the two-phase loop $Q_{TPL}$. A mass flow rate of the fluid in the two-phase loop m is calculated to be about 1.19 g/s based on the following equation, wherein a vapor quality of 0.9 and a latent heat of vaporization of 163.3 kJ/kg are assumed.

$$\dot{m} = \frac{Q_{Chip}}{x h_x} = \frac{175 \text{ W}}{0.9 \times 163.3 \text{ kJ/kg}} = 1.19 \text{ g/s}$$

Thus, $Q_{TPL}$ is estimated to be about 1 W based on the following equation, wherein a change of pressure on the fluid across a pump of about 100 kPa, a pump efficiency of 0.2 (that is, 20%), and a fluid density of 1148 kg/m³ are assumed.

$$Q_{TPL} = \frac{\Delta P \times \dot{m}}{\eta \times \rho} = \frac{100 \text{ kPa} \times 1.19 \text{ g/s}}{0.2 \times 1148 \text{ kg/m}^3} \sim 1 \text{ W}$$

Yet another energy cost for cooling the stack is the power required for preheating the fluid $Q_{preheat}$. Assuming that preheating the fluid raises its temperature from 27° C. to 29.5° C., the $Q_{preheat}$ is calculated to be about 4 W based on the following equation.

$$Q_{Preheat} = \dot{m} C_p \Delta T = 1.19 \text{ g/s} \times 1.4 \text{ J/g-K} \times (29.5 - 27) \sim 4 \text{ W}$$

Adding these three energy costs together ($Q_{cs}$, $Q_{TPL}$, and $Q_{preheat}$), the total cost for dissipating the 175 W of heat from the stack with the example two-phase loop is estimated to be about 11 W (6 W+1 W+4 W), with the coefficient of performance with preheating $COP_{cooling}$ being about 16 based on the following equation.

$$COP_{cooling} = \frac{Q_{Chip}}{Q_{TPL} + Q_{CS} + Q_{Preheat}} \sim 16$$

On the other hand, if preheating the fluid in the two-phase loop is done using waste heat from the fluid of the single-phase loop, the energy cost for preheating $Q_{preheat}$ may effectively be reduced to zero. This means a coefficient of performance without preheating costs $COP_{cooling,w/oPreheat}$ is about 25 based on the following equation.

$$COP_{cooling \ w/o \ Preheat} = \frac{Q_{Chip}}{Q_{TPL} + Q_{CS}} \sim 25$$

Thus, in this example, the use of heat from the single-phase loop to preheat the fluid in the two-phase loop may increase the coefficient of performance of the two-phase loop by about 50%, which may be a significant gain.

Figure 2:
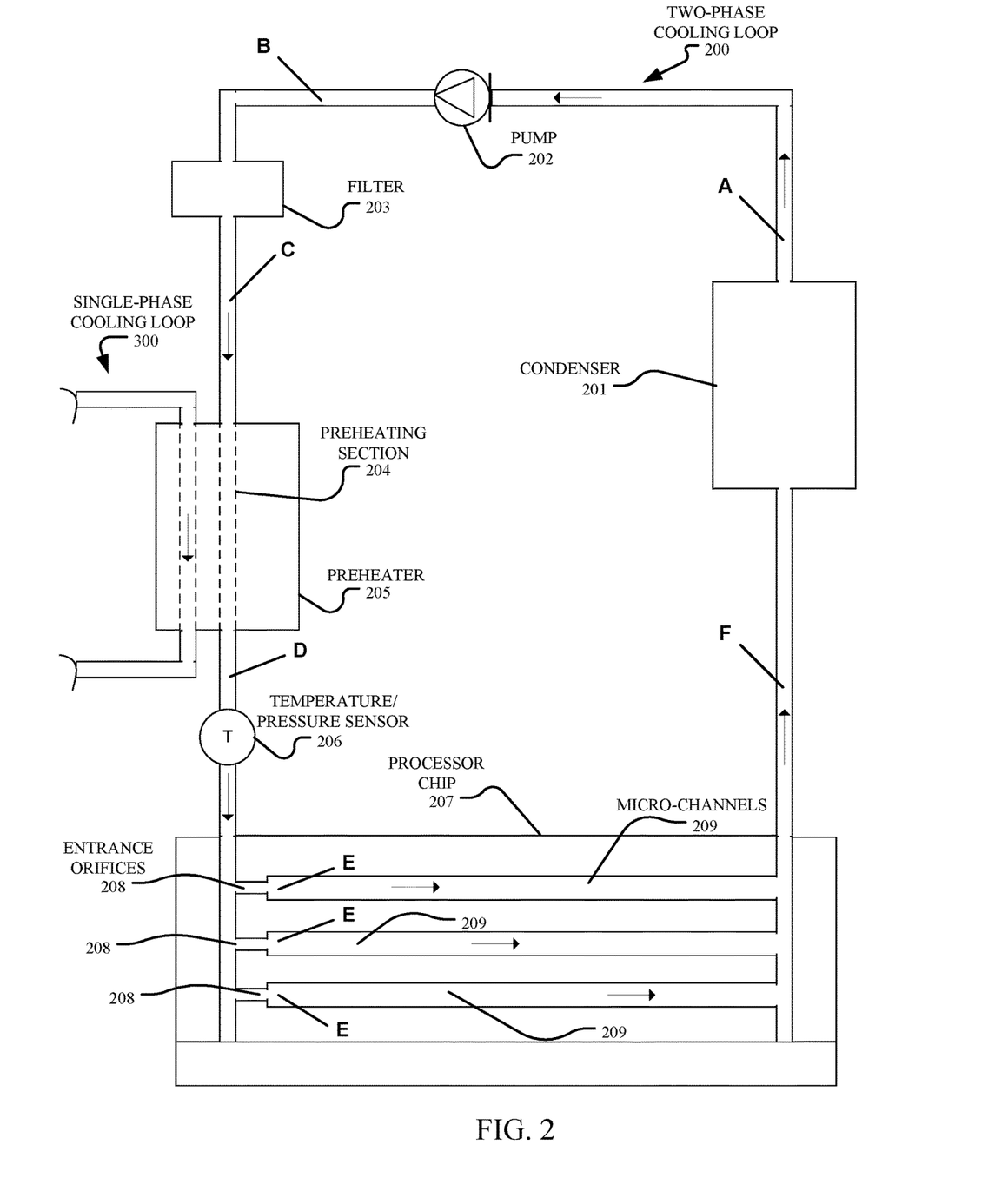
FIG. 2 illustrates a schematic diagram of a mechanically-pumped, two-phase cooling loop configured for using vaporization of a dielectric coolant to cool a processor chip, in accordance with embodiments of the present disclosure.

Referring now to FIG. 2, shown is a schematic diagram of a mechanically-pumped, two-phase cooling loop 200 configured for using vaporization of a dielectric coolant to cool a processor chip 207, in accordance with embodiments of the present disclosure. In the depicted example, the arrows within the two-phase loop 200 represent the direction of flow of the dielectric coolant as it circulates through the two-phase loop 200.

An example iteration of the dielectric coolant completing a revolution within the two-phase loop 200 is described. To begin the iteration, the dielectric coolant is output from a condenser 201 as a saturated liquid. The liquid next passes through a pump 202 that is configured to maintain/adjust the flow rate of the dielectric coolant as it circulates within the two-phase loop 200. In some embodiments, more than one mechanical pump may be utilized at various locations within the two-phase loop 200. The added pressure on the liquid dielectric coolant created by the pump 202, without a corresponding increase in temperature, causes the liquid to be subcooled as it exits the pump 202.

Continuing through the two-phase loop 200, the subcooled liquid then passes through a filter 203. The filter 203 is configured to remove impurities from the liquid. Based on the size of the filter 203, the pressure on the liquid decreases slightly as it passes through the filter 203, however, the liquid remains subcooled. Next, in a preheating section 204 of the two-phase loop 200, the liquid passes through a preheater 205. The preheater 205 is configured to raise the temperature of the liquid passing through it to within a target (e.g., predetermined) temperature range. As described in more detail herein, the preheater 205 uses heat from a portion of a single-phase cooling loop 300 that passes through the preheater 205 to cause this temperature increase in the liquid dielectric coolant. A temperature/pressure sensor 206 then measures the temperature of the liquid as output by the preheater 205. In some embodiments, the temperature/pressure sensor 206 may also measure the pressure at this location. This pressure measurement may be used in determining the saturation temperature of the liquid at this location.

Next, the liquid enters the processor chip 207. The processor chip 207 is thermally coupled to an evaporator configured to flow boil (e.g., vaporize) the dielectric coolant using operational heat generated by the processor chip 207. In the depicted example, the evaporator comprises a plurality of embedded micro-channels 209 having inputs connected to corresponding entrance orifices 208. In some embodiments, the embedded micro-channels 209 may substantially similar to the embedded channels shown in FIG. 1B. Furthermore, in some embodiments, the processor chip 207 may be embedded with other types of micro-cavities through which the dielectric coolant passes rather than, or in addition to, micro-channels 209. As the liquid dielectric coolant passes through the entrance orifices 208, a pressure drop occurs that is sufficient to change the state of the liquid to nearly saturation. In some embodiments, this pressure drop also serves to stabilize the movement of the dielectric coolant passing through the processor chip 207, so as to avoid backflow. At the inlets of the micro-channels 209, the vaporization of the dielectric coolant begins. This vaporization continues as the dielectric coolant passes through the lengths of the micro-channels 209. A liquid-vapor mixture then passes out of the micro-channels 209, out of the processor chip 207, and toward the condenser 201.

Upon entering the condenser 201, the liquid-vapor mixture is condensed and output, to begin a new loop iteration, as subcooled liquid once again. In some embodiments, the condenser 201 is configured to cool the dielectric coolant by drawing waste heat out of it and then transferring the heat to an ambient (e.g., outdoor) environment using a secondary loop containing water. This water within the secondary loop may itself be cooled using pumps that force it through devices such as a wet/dry cooler.

The following Table describes the state of the dielectric coolant at the various locations A-F depicted within the two-phase loop 200.

TABLE

| Location | Liquid Temperature (° C.) | Saturation Temperature (° C.) | Absolute Pressure (kPa) | Vapor Quality |
|---|---|---|---|---|
| A | 27 | 27 | 530 | 0 |
| B | 27 | 33 | 630 | negative |
| C | 27 | 32 | 610 | negative |
| D | 29.5 | 32 | 610 | negative |
| E | 29.5 | 29.5 | 570 | 0 |
| F | 27.5 | 27.5 | 535 | 0.8 |

For the dielectric coolant at each location A-F included within the Table, the liquid temperature, saturation temperature, absolute pressure, and vapor quality are described. For example, at a location A between the output of the condenser 201 and the input of the pump 202, the dielectric coolant has a liquid temperature of 27° C., a saturation temperature of 27° C., an absolute pressure of 530 kPa, and a vapor quality of zero. The liquid temperature and saturation temperature being the same at location A is consistent with the saturated nature of the dielectric coolant as output by the condenser 201. For another example, at a location D between the output of the preheater 205 and the input of the processor chip 207, the dielectric coolant has a liquid temperature of 29.5° C., a saturation temperature of 32° C., an absolute pressure of 610 kPa, and a negative vapor quality. These values at the location D are consistent with the dielectric coolant having been heated by the preheater 205 to a temperature that is higher than at location A but is below the saturation temperature (as supported by the negative vapor quality). For yet another example, at a location F between the output of the micro-channels 209 and the input of the condenser 201, the dielectric coolant has a liquid temperature of 27.5° C., a saturation temperature of 27.5° C., an absolute pressure of 535 kPa, and a vapor quality of 0.8. The vapor quality of 0.8 at the location F is consistent with the dielectric coolant having been partially vaporized within the micro-channels 209. In some embodiments, the vapor quality of dielectric coolant at the output of an evaporator (including micro-channels 209) is desirably between 0.75 and 1.

While an example embodiment of a two-phase loop 200 is depicted in FIG. 2, it should be understood that, in some embodiments, many other variants of the two-phase loop 200 are possible. For example, in some embodiments, the devices within the two-phase loop 200 (e.g., condenser 201, pump 202, and filter 203) may be rearranged within the loop in any suitable arrangement or may not be used at all and other devices (e.g., reservoirs) may be included. For another example, in some embodiments, separate pressure sensors and additional temperature sensors may be included in the two-phase loop 200 so as to allow more precise monitoring of the conditions within the two-phase loop 200. Changes in pressure may result in changes in saturation temperature and therefore may require corresponding temperature adjustments for the dielectric coolant. For yet another example, in some embodiments, other types of evaporators may be used (in addition to or in place of the micro-channels 209), such as cold plate evaporators described herein. For yet another example, in some embodiments, fluids other than the dielectric coolant may be used within the two-phase loop 200. For yet another example, in some embodiments, electronic components other than or in addition to processor chip 207 may be cooled by the two-phase loop 200. For yet another example, in some embodiments, additional heating components may be associated with the preheater 205. These additional heating components may be used in situations where the fluid in the single-phase loop 300 does not provide sufficient heat to the dielectric coolant in the preheating section 204 to increase sufficiently the temperature of the dielectric coolant. These additional heating components may include, for example, a coiled metal heating element that uses electrical current to generate additional heat for heating the dielectric coolant.

Figure 3:
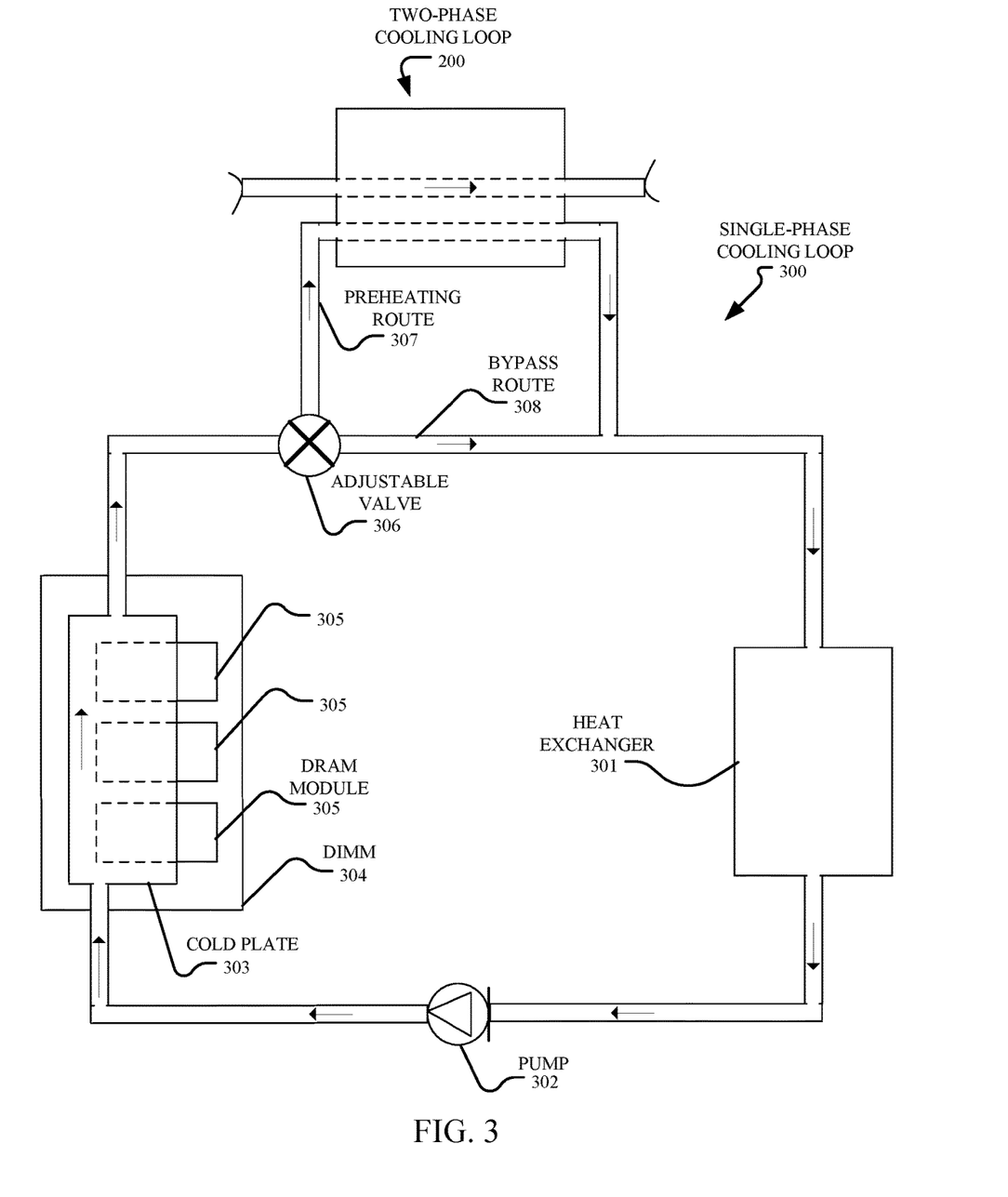
FIG. 3 illustrates a schematic diagram of a mechanically-pumped, single-phase cooling loop configured for using heating of water within the loop to cool a dual in-line memory module (DIMM), in accordance with embodiments of the present disclosure.

Referring now to FIG. 3, shown is a schematic diagram of a mechanically-pumped, single-phase cooling loop 300 configured for using heating of water within the loop to cool a dual in-line memory module (DIMM) 304, in accordance with embodiments of the present disclosure. In the depicted example, the arrows within the single-phase loop 300 represent the direction of flow of the water as it circulates through the single-phase loop 300.

An example iteration of the water completing a revolution within the single-phase loop 300 is described. To begin the iteration, the water is output from a heater exchanger 201 in a cooled state. In some embodiments, this output cooled water may be about 35° C. The cooled water next passes through a pump 302 that is configured to maintain/adjust the flow rate of the water as it circulates within the single-phase loop 300. In some embodiments, more than one mechanical pump may be utilized at various locations within the single-phase loop 300.

Continuing through the single-phase loop 300, the cooled water then passes into a cold plate 303. The cold plate 303 is configured to remove operational heat from DIMM 304 to which cold plate 303 is thermally coupled. Specifically, in the depicted example, the cold plate 303 is connected, via a thermal interface material, to multiple heat-producing dynamic random access memory (DRAM) modules 305 of the DIMM 304. As the water passes through the cold plate 303 the operational heat from the DIMM 304 is transferred into the water, causing the water to become heated as its temperature rises. In some embodiments, the water may be heated in the cold plate to about 40° C. There may be many different possible configurations for the cold plate 303. For example, in some embodiments, the cold plate 303 includes a series of winding tube sections through which the water passes as it is heated.

After passing through an output of the cold plate 303, the now-heated water reaches an adjustable (e.g., metering, apportioning) valve 306. Adjustable valve 306 is configured to divide the flow of the heated water between a preheating route 307 and a bypass route 308. In some embodiments, adjustable valve 306 may be adjustable at multiple degrees between fully open, wherein all of the heated water is forced into the preheating route 307, and fully closed, wherein all of the heated water is forced into the bypass route 308.

Continuing the iteration through the single-phase loop 300, a first portion of the heated water passes into the preheating route 307 at the same time that a second portion of the heated water passes into the bypass route 308. The first portion of the heated water passes closer to the preheating section 204 (described in reference to FIG. 2) of the two-phase loop 200, while the second portion of the heated water passes farther away from the preheating section 204. In the depicted example, the first portion of the heated water flows through the preheater 205 (also described in reference to FIG. 2), becomes thermally coupled to the preheating section 204, and transfers heat to the liquid dielectric coolant flowing through the preheating section 204 causing a temperature increase in the dielectric coolant. The second portion of the heated water flows through the bypass route 308, thereby bypassing the preheating section 204 without becoming thermally coupled thereto. After the first portion of the heated water passes through the output of the preheater 205, it rejoins the second portion of the heated water at a junction between the preheating route 307 and the bypass route 308. The recombined heated water then continues to flow toward the heat exchanger 301.

In some embodiments, a controller (not shown) is configured to adjust the adjustable valve 306, and thereby change the relative proportions (e.g., volumes) of the first portion of the heated water (e.g., the portion of the heated water pumped through the preheating route 307) and the second portion of the heated water (e.g., the portion of the heated water pumped through the bypass route 308). In other words, the controller is configured to change the volumetric flow rates of the first and second portions. Specifically, the controller may be electrically coupled to the adjustable valve 306, such that the controller can increase or decrease the proportion of the heated water that passes through the preheater 205. More heated water passing through the preheater 205 causes the temperature of the dielectric coolant as output by the preheating section 204 to be relatively higher, and less heated water passing through the preheater 205 causes the temperature of the dielectric coolant as output by the preheating section 204 to be relatively lower. In some embodiments, the controller is also electrically coupled to the temperature sensor 206 (described in reference to FIG. 2) so that the controller can determine whether the output temperature of the dielectric coolant is within a target temperature range and, if not, can adjust the adjustable valve 306 accordingly.

Completing the iteration of the single-phase cooling loop 300, the heated water enters the heat exchanger 301 and is cooled and output, to begin a new loop iteration, as cooled water once again. In some embodiments, the heat exchanger 301 is configured to cool the water by drawing waste heat out of it and then transferring the heat to an ambient (e.g., outdoor) environment using a secondary loop containing a separate body of flowing water. This water within the secondary loop may itself be cooled using pumps that force it through devices such as a wet/dry cooler. In some embodiments, the heat-exchanger 301 may share a secondary loop with the condenser 201 (described in reference to FIG. 2).

While an example embodiment of a single-phase loop 300 is depicted in FIG. 3, it should be understood that, in some embodiments, many other variants of the single-phase loop 300 are possible. For example, in some embodiments, the devices within the single-phase loop 300 (e.g., heat exchanger 301, pump 302, and valve 306) may be rearranged within the loop in any suitable arrangement or may not be used at all and other devices may be included. For another example, in some embodiments, pressure sensors and temperature sensors may be included in the single-phase loop 300 so as to allow more precise monitoring of the conditions within the single-phase loop 300. For yet another example, in some embodiments, fluids other than water may be used within the single-phase loop 300 (e.g., a mixture of water and antifreeze). For yet another example, in some embodiments, electronic components other than or in addition to DIMM 304 may be cooled by the single-phase loop 300. For yet another example, in some embodiments, other valves or devices for adjusting the flow the water in the single-phase loop 300 may be used instead of or in addition to adjustable valve 306.

Figure 4:
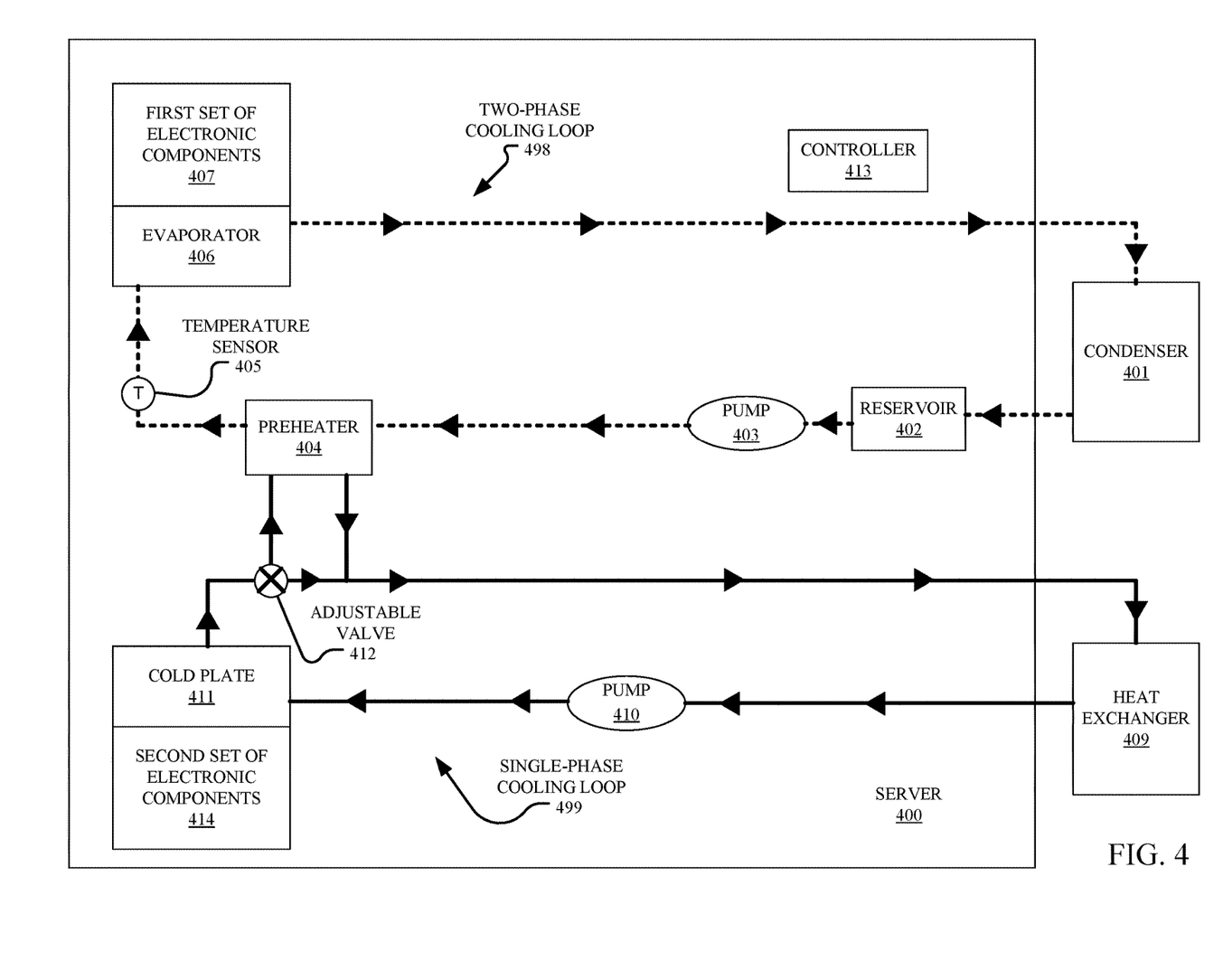
FIG. 4 illustrates a schematic diagram of a cooling system for a server that includes a two-phase cooling loop for cooling a first set of electronic components of the server and further includes a single-phase cooling loop for cooling a second set of electronic components of the server, in accordance with embodiments of the present disclosure.

Referring now to FIG. 4, shown is a schematic diagram of a cooling system for a server 400 that includes a two-phase cooling loop 498 for cooling a first set of electronic components 407 of the server 400 and further includes a single-phase cooling loop 499 for cooling a second set of electronic components 414 of the server 400, in accordance with embodiments of the present disclosure. In the depicted example, the dotted lines represent the tubing of the two-phase cooling loop 498 and the solid lines represent the tubing of the single-phase cooling loop 499. In addition, the arrows within the cooling loops 498, 499 represent the direction of flow of the fluid circulating within each cooling loop 498, 499. Furthermore, the fluid circulating within the two-phase cooling loop 498 is denoted herein as the first fluid and the fluid circulating within the single-phase cooling loop 499 is denoted herein as the second fluid.

The circulation of the first fluid through the two-phase cooling loop 498 is described herein. To begin, the first fluid is pumped out of a condenser 401 and passed into a reservoir 402. The first fluid (in liquid form) is passed through a pump 403 configured to continue pumping the first fluid throughout the two phase loop 498. The first fluid is then pumped through a preheating section where it is heated by a preheater 404. A temperature sensor 405 monitors the temperature of the first fluid as output from the preheater 404. In some embodiments, the pressure of the first fluid is also measured at this location.

The first fluid is then pumped into an input of an evaporator 406 that is thermally coupled to a first set of electronic components 407. The evaporator 406 vaporizes (e.g., flow boils), at least partially, the first fluid using operational heat generated by the first set of electronic components 407 and thereby cools the first set of electronic components 407. In some embodiments, the evaporator 406 includes a plurality of micro-channels (e.g., micro-channels 209 of FIG. 2) or other micro-cavities embedded within the first set of electronic components 407. In such embodiments, the micro-cavities may be embedded within individual electronic components (e.g., processor chips, accelerators, memory chips) that make up the first set of electronic components 407. On the other hand, the micro-cavities may be formed between pairs of electronic components that make up the first set of electronic components (e.g., micro-cavities formed between a pair of stacked processor chips). In some other embodiments, the evaporator 406 is a cold plate attached to the first set of electronic components 407. In some embodiments, the first set of electronic components 407 is a set of high heat flux electronic components.

From an output of the evaporator 406, the vaporized first fluid is pumped into an input of the condenser 401, wherein the vaporized first fluid is condensed and output back toward the reservoir 402 again.

The circulation of the second fluid through the single-phase cooling loop 499 is described herein. In some embodiments, the second fluid remains in a liquid phase throughout the entirety of the single-phase loop 499. To begin, the second fluid is pumped out of a heat exchanger 409 (e.g., in a cooled state) and passed through a pump 410 configured to continue pumping the second fluid throughout the single-phase loop 499.

The second fluid is then pumped into an input of a cold plate 411 that is thermally coupled to a second set of electronic components 414. The cold plate 411 heats the second fluid using operational heat generated by the second set of electronic components 414 and thereby cools the second set of electronic components 414. In some embodiments, the second set of electronic components 414 is a set of low heat flux electronic components.

The second fluid (now in a heated state) is then pumped out of the cold plate 411 and toward the heat exchanger 409. Between the output of the cold plate 411 and the input of the heat exchanger 409, an adjustable valve 412 apportions the second fluid into a first portion and a second portion. The first portion of the second fluid is pumped toward the heat exchanger 409 via a first route (which includes a first set of tubing) while the second portion of the second fluid is pumped toward the heat exchanger 409 via a second route (which includes a second set of tubing). The first and second routes are arranged such that the first portion passes closer to the preheating section of the two-phase cooling loop 498 than the second portion passes to that preheating section. In the depicted example, the first route is arranged such that the first portion of the second fluid is pumped within the preheater 404 and heats the first fluid as the first fluid is pumped through the preheater 404. After the preheater 404, the first route and second route rejoin and the recombined first and second portions of the second fluid continue toward the heat exchanger 409. The second fluid is then pumped into the heat exchanger 409, wherein the second fluid is cooled and output back toward the pump 410 again.

In some embodiments, the controller 413 is responsible for maintaining the temperature of the first fluid as output by the preheater 404 within a target temperature range. To achieve this goal, the controller 413 is electrically coupled to both the temperature sensor 405 and the adjustable valve 412. The controller 413 uses these connections to servo the condition of the first fluid as output by the preheater and make adjustments accordingly. Specifically, in response to determining (e.g., detecting) that the temperature of the first fluid (as measured by the temperature sensor 405) is outside of the target temperature range, the controller 413 causes a change in the volumetric flow rate of the first portion of the second fluid being pumped through the first route and also causes a change in the volumetric flow rate of the second portion of the second fluid being pumped through the second route. In some embodiments, the controller 413 causes these changes by adjusting the adjustable valve 412. For example, in response to determining that the first fluid is above the target temperature range, the controller 413 may adjust the adjustable valve 412 so that more of the second fluid is pumped into the second route (e.g., increasing the volumetric flow rate of the second portion and moving more of the heated second fluid away from the preheater 404) and so that less of the second fluid is pumped into the first route (e.g., decreasing the volumetric flow rate of the first portion and moving less of the heated second fluid toward the preheater 404). For another example, in response to determining that the first fluid is below the target temperature range, the controller 413 may adjust the adjustable valve 412 so that less of the second fluid is pumped into the second route and so that more of the second fluid is pumped into the first route.

Figure 5A:
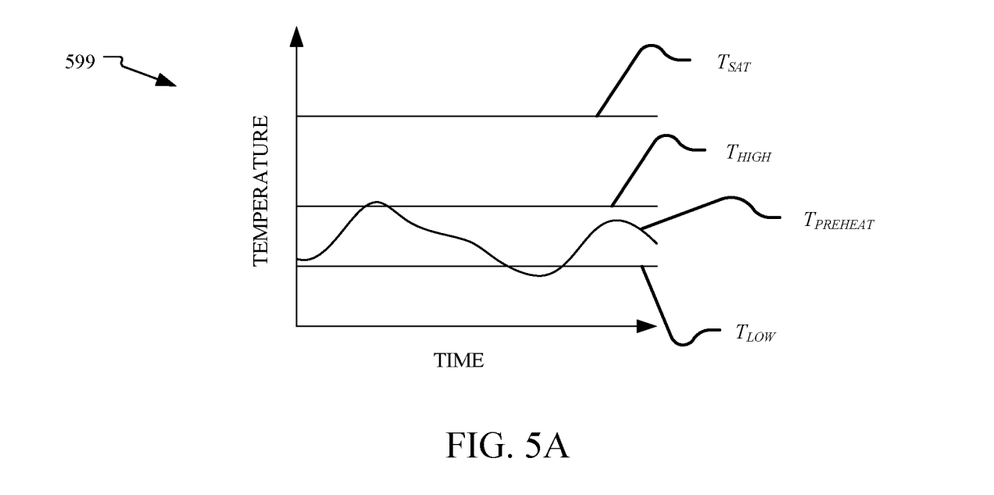
FIG. 5A illustrates a graph depicting variances in the temperature of a preheated dielectric coolant over time, in accordance with embodiments of the present disclosure.

Referring now to FIG. 5A, shown is graph 599 depicting variances in the temperature of a preheated dielectric coolant over time, in accordance with embodiments of the present disclosure. In some embodiments, the preheating temperature ($T_{PREHEAT}$) of the dielectric coolant as output by a preheater in a two-phase loop (e.g., two-phase cooling loop 200 of FIG. 2) may be maintained within a target temperature range. In some embodiments, this target temperature range may be bounded by a low-end acceptable temperature ($T_{LOW}$) and by a high-end acceptable temperature ($T_{HIGH}$). The temperatures within the target temperature range may be a few degrees below the saturation temperature of the dielectric coolant ($T_{SAT}$) at the pressure at the location where the preheating temperature is measured (e.g., location D of FIG. 2), with the difference between this saturation temperature and the high-end acceptable temperature being equal to the expected drop in saturation temperature between the location where the temperature is measured after the preheater and the location where the dielectric coolant enters the evaporator (e.g., location E of FIG. 2). In other words, the high-end acceptable temperature may be equal to the saturation temperature at the inlet to the evaporator. Furthermore, in some embodiments, the low-end acceptable temperature may be at an acceptable (if less than optimal) margin below the high-end acceptable temperature.

Using information from the Table shown above, examples of the values of $T_{PREHEAT}$, $T_{LOW}$, $T_{HIGH}$, and $T_{SAT}$ can be described for the dielectric coolant flowing in the two-phase loop 200 shown in FIG. 2. Specifically, the $T_{PREHEAT}$ of that dielectric coolant may be maintained between a $T_{HIGH}$ of 29.5° C. (equal to the saturation temperature at location E) and a $T_{LOW}$ of 27.5° C. The $T_{SAT}$ may be 32° C. (equal to the saturation temperature at location D).

In some embodiments, allowing the preheating temperature to move outside of the target temperature range may have detrimental effects on the ability of the evaporator to cool the electronic components to which the evaporator is thermally coupled. Specifically, allowing the preheating temperature of the dielectric coolant to get too low may mean that the temperature of the dielectric coolant may need to be increased substantially upon entering the evaporator before it begins to vaporize. On the other hand, allowing the preheating temperature of the dielectric coolant to get too high may mean that the dielectric coolant reaches saturation temperature and begins vaporizing before the dielectric coolant reaches the evaporator (e.g. the vaporization begins in the entrance orifices 208 of FIG. 2).

Figure 5B:
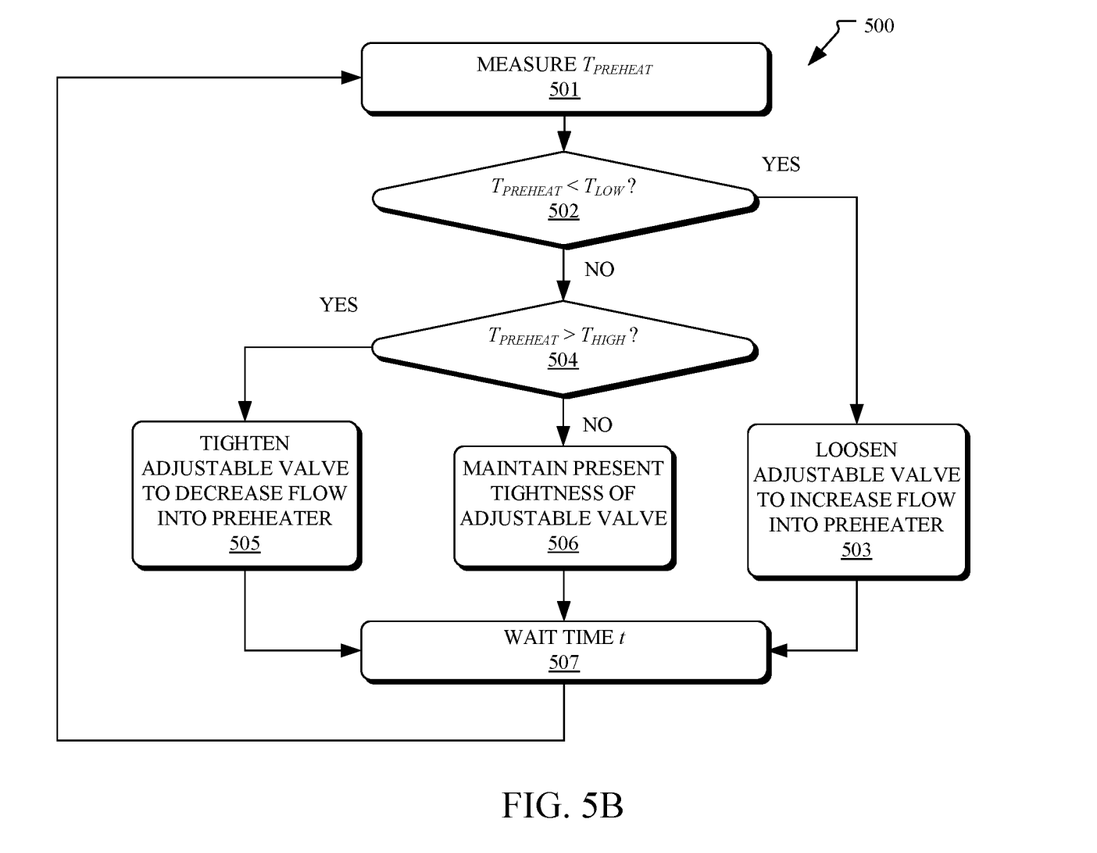
FIG. 5B illustrates a flowchart of an example method for adjusting an adjustable valve in order to maintain a preheating temperature of a dielectric coolant within a target temperature range, in accordance with embodiments of the present disclosure.

Referring now to FIG. 5B, shown is a flowchart of an example method 500 for adjusting an adjustable valve in order to maintain a preheating temperature of a dielectric coolant within a target temperature range, in accordance with embodiments of the present disclosure. In some embodiments, the preheating temperature may be the same preheating temperature that is described in reference to FIG. 5A. In some embodiments, one or more operations of the method 500 may be performed by a controller (e.g., controller 413 of FIG. 4).

The method 500 may begin at operation 501, wherein the controller measures the preheating temperature. Per operation 502, the controller determines whether the preheating temperature is less than the low-end acceptable temperature for the target temperature range. If the preheating temperature is less than the low-end temperature, then, per operation 503, an adjustable valve in a single-phase loop (e.g., single-phase cooling loop 300 of FIG. 3) is loosened so that there is an increase in the flow of heated water in the single-phase loop toward the preheater of the two-phase loop (e.g., more of the heated water is pumped through the preheating route 307 of FIG. 3). If, however, in operation 502, the preheating temperature is determined to be greater than or equal to the low-end temperature, then, per operation 504, the controller determines whether the preheating temperature is greater than the high-end acceptable temperature for the target temperature range. If the preheating temperature is greater than the high-end temperature, then, per operation 505, the adjustable valve in a single-phase loop is tightened so that there is a decrease in the flow of heated water in the single-phase loop toward the preheater of the two-phase loop (e.g., less of the heated water is pumped through the preheating route 307 of FIG. 3).

If the preheating temperature is within the target temperature range (e.g., the preheating temperature is neither less than the low-end temperature nor greater than the high-end temperature), then, per operation 506, the adjustable valve is maintained at its present tightness. Once the adjustable valve has been tightened, loosened, or maintained (as appropriate), then, per operation 507, the controller waits a scheduled about of time (t) before once again measures the preheating temperature, per operation 501.

Figure 6:
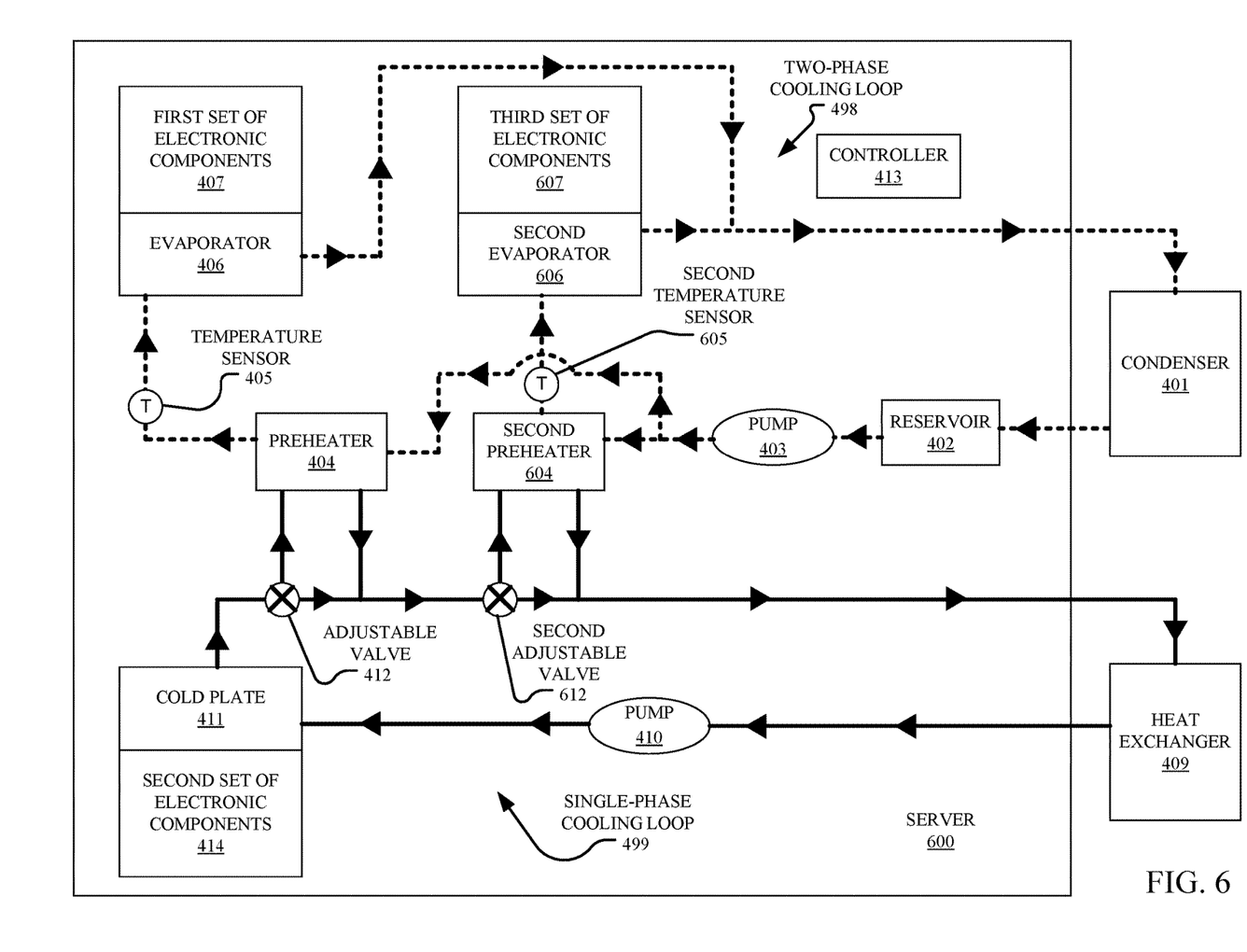
FIG. 6 illustrates a schematic diagram of a cooling system for a server that is an alternate embodiment of the server of FIG. 4, wherein the two-phase cooling loop includes an additional preheater and an additional set of electronic components to be cooled, in accordance with embodiments of the present disclosure.

Referring now to FIG. 6, shown is a schematic diagram of a cooling system for a server 600 that is an alternate embodiment of the server 400 of FIG. 4, wherein the two-phase cooling loop 498 includes an additional preheater and an additional set of electronic components to be cooled, in accordance with embodiments of the present disclosure. In the depicted example, the server 600 may be substantially similar to the server 400 of FIG. 4 with the exception of the additional components and devices described herein. These additional components and devices may allow the two-phase cooling loop 498 to cool a third set of electronic components 607 in addition to the first set of electronic components 407.

In the depicted example, within the two-phase cooling loop 498, after the first fluid (in liquid form) is passed through the pump 403, a portion of the first fluid is separated from the remainder of the first fluid. The remainder of the first fluid may complete the circulation through the two-phase loop 498 substantially as described in reference to FIG. 4. The separated portion of the first fluid, however, takes a different path that passes through a second preheating section where the separated portion is heated by a second preheater 604. A second temperature sensor 605 monitors the temperature of the separated portion of the first fluid as output from the second preheater 604. In some embodiments, the pressure may also be monitored at this location.

The separated portion is then pumped into an input of a second evaporator 606 that is thermally coupled to a third set of electronic components 607. The second evaporator 606 vaporizes, at least partially, the separated portion using operational heat generated by the third set of electronic components 607. In some embodiments, the second evaporator 606 may be designed similarly too or different from the evaporator 406. From an output of the second evaporator 606, the vaporized separated portion rejoins the remainder of the first fluid as both are pumped back toward, and then into, the input of the condenser 401, wherein the vaporized first fluid is condensed and output back toward the reservoir 402 again.

The circulation of the second fluid through the single-phase cooling loop 499 within server 600 may also be substantially the same as the circulation of the second fluid through the single phase loop 499 within server 400 of FIG. 4, except as described herein. In some embodiments, the second fluid remains in a liquid phase throughout the entirety of the single-phase loop 499.

In the depicted example, after the rejoinder of the first and second routes and associated recombination of the first and second portions of the second fluid (as described in reference to FIG. 4), the recombined second fluid is pumped toward a second adjustable valve 612 that is disposed between the first adjustable valve 412 and the input of the heat exchanger 409. The second adjustable valve 612 reapportions the second fluid into a third portion and a fourth portion. The third portion of the second fluid is pumped toward the heat exchanger 409 via a third route while the fourth portion of the second fluid is pumped toward the heat exchanger 409 via a fourth route. In the depicted example, the third route is arranged such that the third portion of the second fluid is pumped within the second preheater 604 and heats the separated portion of the first fluid as the separated portion is pumped through the second preheater 604. After the second preheater 604, the third route and fourth route rejoin and the recombined third and fourth portions of the second fluid continue toward the heat exchanger 409.

In some embodiments, the controller 413 of server 600, in addition to being responsible for maintaining the temperature of the first fluid as output by the preheater 404 within a target temperature range, is also responsible for maintaining the temperature of the separated portion of the first fluid as output by the second preheater 604 within the target temperature range. To achieve this goal, the controller 413 is electrically coupled to both the second temperature sensor 605 and the second adjustable valve 612. In response to determining (e.g., detecting) that the temperature of the separate portion of the first fluid (as measured by the second temperature sensor 605) is outside of the target temperature range, the controller 413 causes a change in the volumetric flow rate of the third portion of the second fluid being pumped through the third route and also causes a change in the volumetric flow rate of the fourth portion of the second fluid being pumped through the fourth route. In some embodiments, the controller 413 causes these changes by adjusting the second adjustable valve 612.

As discussed in more detail herein, it is contemplated that some or all of the operations of some of the embodiments of methods described herein may be performed in alternative orders or may not be performed at all; furthermore, multiple operations may occur at the same time or as an internal part of a larger process.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the foregoing detailed description of exemplary embodiments of the various embodiments, reference was made to the accompanying drawings (where like numbers represent like elements), which form a part hereof, and in which is shown by way of illustration specific exemplary embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the foregoing description, numerous specific details were set forth to provide a thorough understanding the various embodiments. But, the various embodiments may be practiced without these specific details. In other instances, well-known circuits, structures, and techniques have not been shown in detail in order not to obscure embodiments.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. A computer program product comprising a computer readable storage medium having program instructions embodied therewith, the program instructions configured to cause a processor to control a set of mechanical pumps such that the set of mechanical pumps performs a method comprising:

pumping a first fluid through an evaporator thermally coupled to a first set of electronic components while circulating within a first cooling loop such that the first fluid is vaporized, at least partially, using operational heat generated by the first set of electronic components as it passes through the evaporator;

pumping the first fluid through a preheating section disposed in the first cooling loop between an output of a condenser and an input of the evaporator;

pumping a second fluid through a cold plate thermally coupled to a second set of electronic components while circulating within a second cooling loop such that the second fluid is heated using operational heat generated by the second set of electronic components as it passes through the cold plate such that there is an increase in a temperature of the second fluid;

pumping a first portion of the second fluid as output from the cold plate toward an input of a heat exchanger via a first route disposed in the second cooling loop, the first route thermally coupled to the preheating section such that heat transfer from the first portion to the preheating section as the first portion passes through the first route causes an increase in a temperature of the first fluid as the first fluid passes through the preheating section; and pumping a second portion of the second fluid as output from the cold plate toward the input of the heat exchanger via a second route disposed in the second cooling loop, the second route arranged such that the first portion passes closer to the preheating section of the first loop than the second portion passes to the preheating section.

2. The computer program product of claim 1, wherein the program instructions are further configured to cause the processor to:

determine that the temperature of the first fluid as output by the preheating section is above a target temperature range; and cause, in response to the determining and via the set of mechanical pumps, the second portion of the second fluid being pumped through the second route to increase in volumetric flow rate and the first portion of the second fluid being pumped through the first route to decrease in volumetric flow rate.

3. The computer program product of claim 2, wherein the causing the second portion of the second fluid to increase in volumetric flow rate and the first portion of the second fluid to decrease in volumetric flow rate comprises:

causing an adjustment in an adjustable valve disposed in the second cooling loop between the output of the cold plate and the input of the heat exchanger, the adjustable valve configured to apportion the second fluid between the first route and the second route.

4. The computer program product of claim 2, wherein the program instructions are further configured to cause the processor to:

monitor, via a temperature sensor electrically coupled to the processor, the temperature of the first fluid as output from the preheating section.

5. The computer program product of claim 1, wherein the pumping the first fluid through the preheating section is performed by a first subset of the set of mechanical pumps that are disposed in the first cooling loop, and wherein the pumping the first and second portions of the second fluid as output from the cold plate is performed by a second subset of the set of mechanical pumps that are disposed in the second cooling loop.

6. The computer program product of claim 1, wherein the program instructions are further configured to cause the processor to:

cause the condenser to condense the vaporized first fluid output from the evaporator as the vaporized first fluid passes through the condenser while circulating through the first loop toward the evaporator; and cause the heat exchanger to cool the second fluid as output from the cold plate as the second fluid passes through the heat exchanger while circulating through the second loop toward the cold plate.

7. The computer program product of claim 1, wherein the first cooling loop is a mechanically-pumped, two-phase closed cooling loop configured for cooling the first set electronic components, and wherein the second cooling loop is a mechanically-pumped, single-phase closed cooling loop configured for cooling the second set electronic components.

8. The computer program product of claim 1, wherein the first set of electronic components includes a processor chip, and wherein the evaporator comprises a plurality micro-channels embedded within the processor chip such that operational heat from the processor chip causes flow boiling of the first fluid passing through the plurality of micro-channels.

9. The computer program product of claim 1, wherein the first set of electronic components includes a processor chip, and wherein the evaporator comprises a second cold plate attached to the processor chip such that operational heat from the processor chip causes flow boiling of the first fluid passing through the second cold plate.

10. A method comprising:
vaporizing, at least partially, a first fluid, as it passes through an evaporator thermally coupled to a first set of electronic components while circulating within a first cooling loop, using operational heat generated by the first set of electronic components;
pumping the first fluid through a preheating section disposed in the first cooling loop between an output of a condenser and an input of the evaporator;
heating a second fluid, as it passes through a cold plate thermally coupled to a second set of electronic components while circulating within a second cooling loop, using operational heat generated by the second set of electronic components such that there is an increase in a temperature of the second fluid;
pumping a first portion of the second fluid as output from the cold plate toward an input of a heat exchanger via a first route disposed in the second cooling loop, the first route thermally coupled to the preheating section such that heat transfer from the first portion to the preheating section as the first portion passes through the first route causes an increase in a temperature of the first fluid as the first fluid passes through the preheating section; and
pumping a second portion of the second fluid as output from the cold plate toward the input of the heat exchanger via a second route disposed in the second cooling loop, the second route arranged such that the first portion passes closer to the preheating section of the first loop than the second portion passes to the preheating section.

11. The method of claim 10 further comprising:
determining, by a controller, that the temperature of the first fluid as output by the preheating section is above a target temperature range; and causing, in response to the determining and by the controller, the second portion of the second fluid being pumped through the second route to increase in volumetric flow rate and the first portion of the second fluid being pumped through the first route to decrease in volumetric flow rate.

12. The method of claim 11, wherein the causing the second portion of the second fluid to increase in volumetric flow rate and the first portion of the second fluid to decrease in volumetric flow rate comprises:
adjusting an adjustable valve disposed in the second cooling loop between the output of the cold plate and the input of the heat exchanger, the adjustable valve configured to apportion the second fluid between the first route and the second route.

13. The method of claim 11 further comprising:
monitoring, by a temperature sensor electrically coupled to the controller, the temperature of the first fluid as output from the preheating section.

14. The method of claim 10, wherein the pumping the first fluid through the preheating section is performed by a first set of mechanical pumps disposed in the first cooling loop, and wherein the pumping the first and second portions of the second fluid as output from the cold plate is performed by a second set of mechanical pumps disposed in the second cooling loop.

15. The method of claim 10, further comprising:
condensing, by the condenser, the vaporized first fluid output from the evaporator as the vaporized first fluid passes through the condenser while circulating through the first loop toward the evaporator; and
cooling, by the heat exchanger, the second fluid as output from the cold plate as the second fluid passes through the heat exchanger while circulating through the second loop toward the cold plate.

16. The method of claim 10, wherein the first cooling loop is a mechanically-pumped, two-phase closed cooling loop configured for cooling the first set electronic components, and wherein the second cooling loop is a mechanically-pumped, single-phase closed cooling loop configured for cooling the second set electronic components.

17. The method of claim 10, wherein the first set of electronic components includes a processor chip, and wherein the evaporator comprises a plurality micro-channels embedded within the processor chip such that operational heat from the processor chip causes flow boiling of the first fluid passing through the plurality of micro-channels.

18. The method of claim 10, wherein the first set of electronic components includes a processor chip, and wherein the evaporator comprises a second cold plate attached to the processor chip such that operational heat from the processor chip causes flow boiling of the first fluid passing through the second cold plate.

19. The method of claim 10, wherein the second set of electronic components comprises a dual in-line memory module.

20. The method of claim 10, wherein the first set of electronic components are high heat flux electronic components, and wherein the second set of electronic components are low heat flux electronic components.

* * * * *